(12) United States Patent
Gundlach et al.

(10) Patent No.: US 6,236,573 B1
(45) Date of Patent: May 22, 2001

(54) APPARATUS AND METHOD FOR SINGLE-HANDED MANIPULATION OF LATCHING PLUGGABLE ELECTRONIC COMPONENT

(75) Inventors: John Geoffrey Gundlach, Raleigh; Paul A. Wormsbecher, Apex, both of NC (US)

(73) Assignee: International Business Machines Corporation

( * ) Notice: Subject to any disclaimer, the term of this patent is extended or adjusted under 35 U.S.C. 154(b) by 0 days.

(21) Appl. No.: 09/334,068

(22) Filed: Aug. 20, 1999

(51) Int. Cl.⁷ .................................................... H05K 7/12
(52) U.S. Cl. ......................... 361/801; 312/320; 361/709
(58) Field of Search ............................. 361/801, 802, 361/809, 252, 259, 685, 709; 4/240; 439/377, 64, 327–328, 160; 174/259, 258, 257; 312/320; 211/41

(56) References Cited

U.S. PATENT DOCUMENTS

| | | |
|---|---|---|
| 3,245,546 | 4/1966 | Stuhler . |
| 3,567,303 * | 3/1971 | Fox et al. ............................. 312/320 |
| 3,577,113 | 5/1971 | Maitland . |
| 4,002,386 | 1/1977 | McKenzie . |
| 4,435,029 | 3/1984 | McKenzie . |
| 4,881,911 | 11/1989 | Haddock et al. . |
| 4,976,630 | 12/1990 | Schuder et al. . |
| 5,748,446 * | 5/1998 | Feightner et al. .................... 361/709 |
| 5,943,218 * | 8/1999 | Liu ....................................... 361/801 |

\* cited by examiner

*Primary Examiner*—Jayprakash N. Gandhi
*Assistant Examiner*—Thanh Y. Tran
(74) *Attorney, Agent, or Firm*—John B. Schelkopf; Andrew Dillon

(57) ABSTRACT

A computer processor cartridge is connected to a socket on a motherboard. The cartridge has a detachable bracket that secures it to a retention mechanism mounted to the board. The bracket is formed from flexible plastic and has a handle with downward depending arms on each end. Each arm has a tooth on its outer surface. The retention mechanism has a base with a pair of upright support posts on its ends. Each post has a hole in its side for receiving the teeth on the bracket. The cartridge and bracket assembly is installed in the retention mechanism pushing down on the handle such that the lower end of the assembly seats between the support posts. When the teeth engage the holes in the support posts, the assembly is locked in place and the cartridge is connected to the socket. The assembly is disconnected by pulling up on the handle. The plastic bracket elastically flexes so that the arms pivot the teeth out of the holes. Additional upward force on the handle pulls the cartridge out of the socket so that the assembly can be completely removed from the retention mechanism.

25 Claims, 8 Drawing Sheets

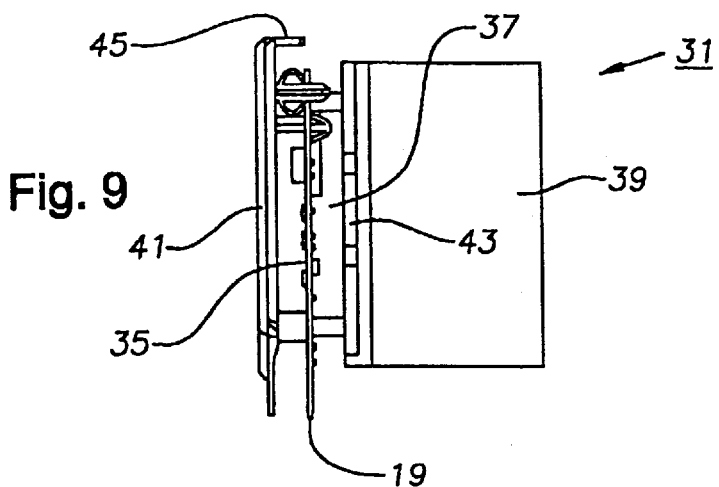
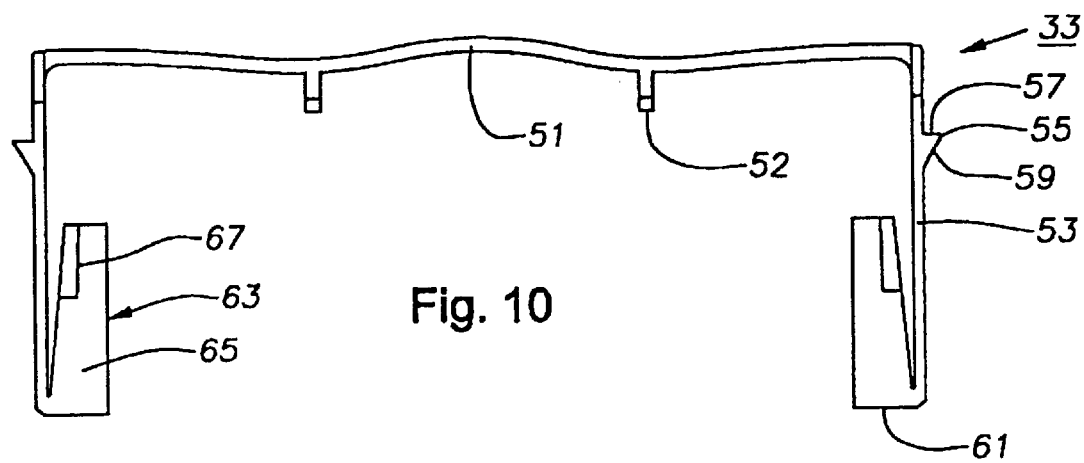
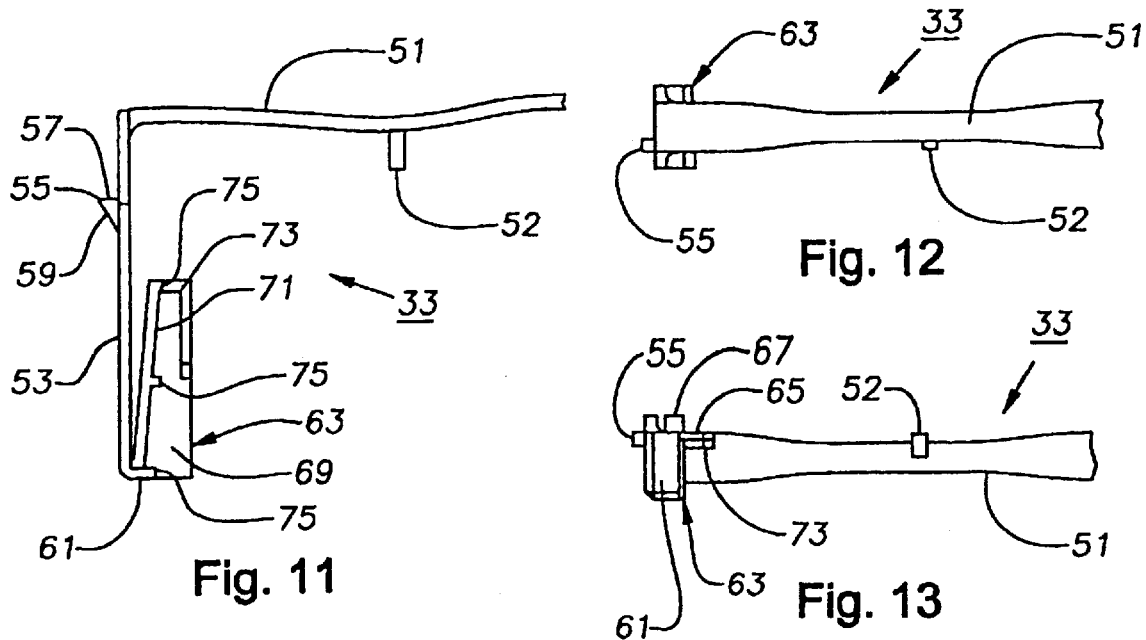

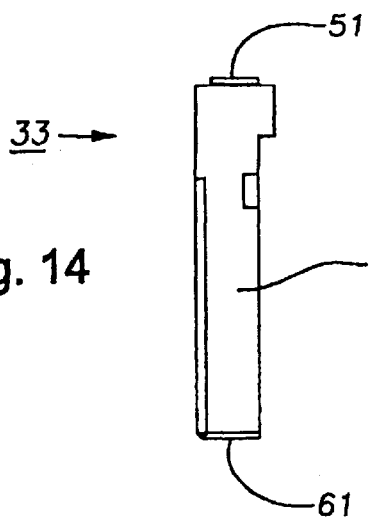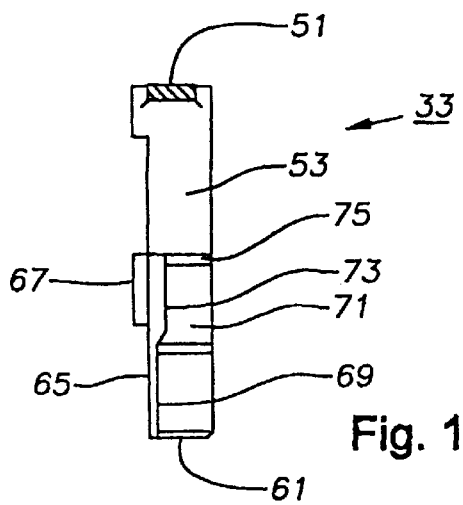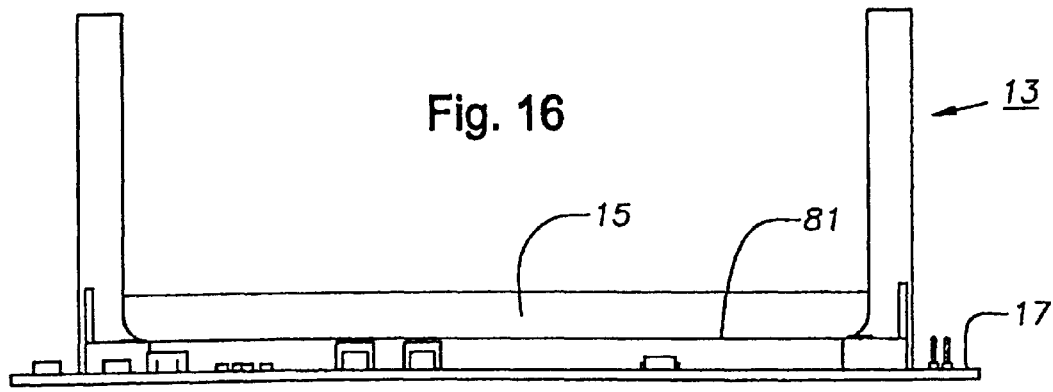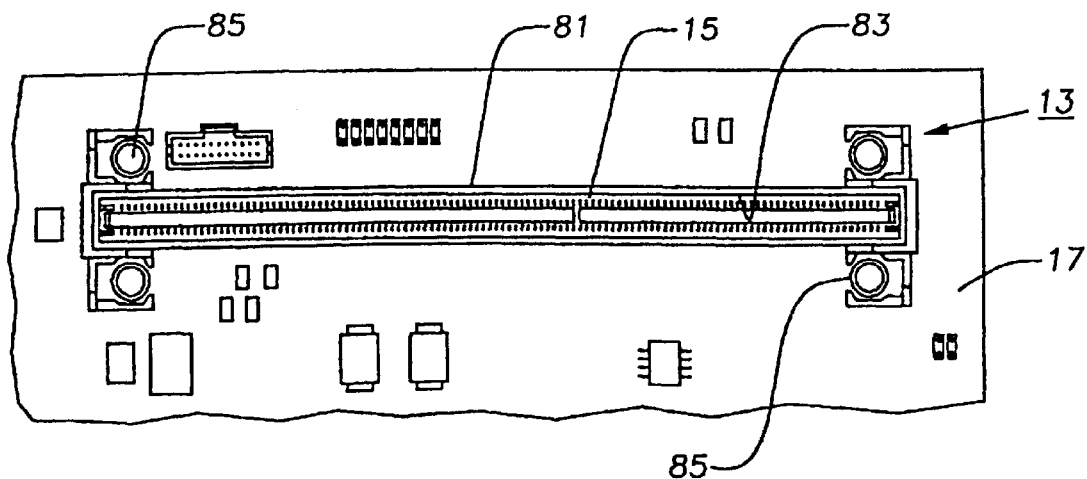

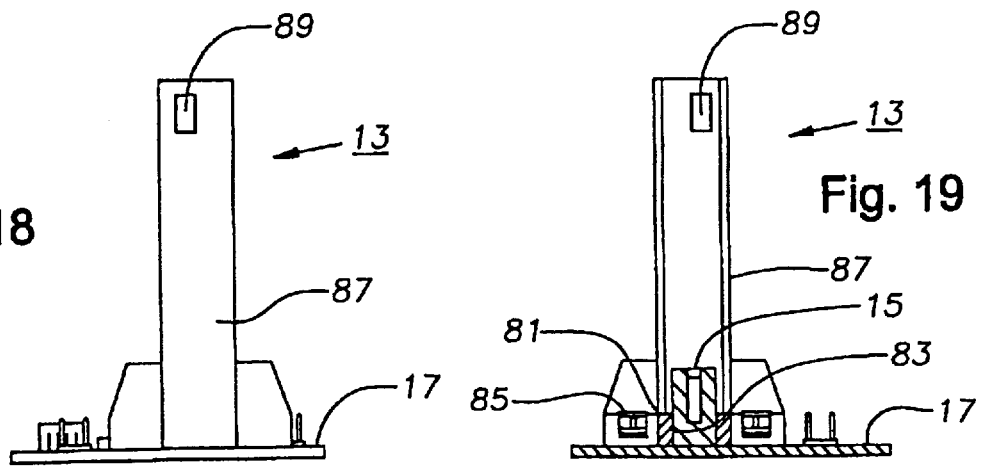
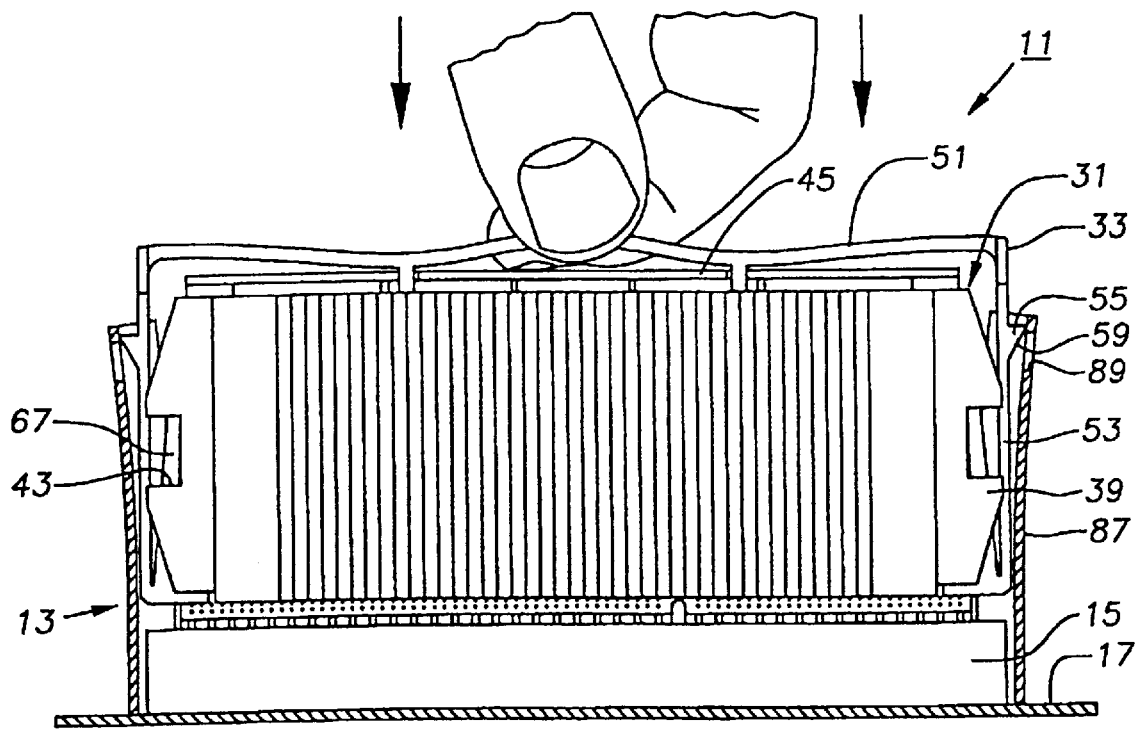

APPARATUS AND METHOD FOR SINGLE-HANDED MANIPULATION OF LATCHING PLUGGABLE ELECTRONIC COMPONENT

BACKGROUND OF THE INVENTION

1. Technical Field

This invention relates in general to installing and removing a pluggable electronic component into and out of a socket, and in particular to a bracket that enables single-handed installation and removal of a latching pluggable computer processor cartridge with respect to a socket and retention mechanism mounted on a main system circuit board.

2. Background Art

In computer equipment, the need to upgrade and/or replace electrical components is more prevalent than ever. Many different solutions for installing new components or removing existing components are known in the prior art. However, not all devices or methods allow technicians to perform the work efficiently and reliably. This is particularly true for components that require fasteners such as screws for mounting purposes, or those that require latching or retention mechanisms for enhanced retention capability. Moreover, some new components are not compatible with the existing retention mechanisms that were used with the previous components that they are replacing.

One example of a prior art solution for these problems is a squeezable latch. This latch mounts to a component and has two engagement points that are spaced apart on opposite sides of the component. The engagement points engage a retention mechanism that is mounted to a main system circuit board. If the subject component is small enough, a technician can operate the latch with one hand by squeezing the latch at the engagement points. However, with larger components such as processor module cartridges, the technician must use two hands to operate the latch. Moreover, this latch can be mishandled by the technician and result in uneven insertion/extraction of the component. If the force exerted on the component is uneven, it may be "rocked" into or out of place, thereby increasing the probability for damage to the connectors.

Another prior art example is the cam-type lever. If the device is single-sided, only one side of the component is clamped which can result in uneven insertion/extraction. Dual cam devices are workable, but they have more parts and require the technician to use both hands. There are other types of manual release mechanisms, but many of these are unnecessarily complex and require multiple, simultaneous operations to be performed by the technician to achieve insertion/extraction. Furthermore, these operations also typically cause the component to be rocked out of place and may cause damage. Thus, an improved apparatus and method for single-handedly and reliably installing and removing a latching electrical component with respect to a socket and retention mechanism mounted on a main system circuit board is needed.

SUMMARY OF THE INVENTION

A computer processor cartridge is connected to a socket on a motherboard. The cartridge has a detachable bracket that secures it to a retention mechanism mounted to the board. The bracket is formed from flexible plastic and has a handle with downward depending arms on each end. Each arm has a tooth on its outer surface. The retention mechanism has a base with a pair of upright support posts on its ends. Each post has a hole in its side for receiving the teeth on the bracket.

The cartridge and bracket assembly is installed in the retention mechanism pushing down on the handle such that the lower end of the assembly seats between the support posts. When the teeth engage the holes in the support posts, the assembly is locked in place and the cartridge is connected to the socket. The assembly is disconnected by pulling up on the handle. The plastic bracket elastically flexes so that the arms pivot the teeth out of the holes. Additional upward force on the handle pulls the cartridge out of the socket so that the assembly can be completely removed from the retention mechanism.

BRIEF DESCRIPTION OF THE DRAWINGS

So that the manner in which the features, advantages and objects of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only a preferred embodiment of the invention and is therefore not to be considered limiting of its scope as the invention may admit to other equally effective embodiments.

FIG. 9 is a side view of the cartridge of FIG. 1.

FIG. 10 is a front view of the bracket of FIG. 1.

FIG. 11 is a rear view of one side of the bracket of FIG. 1.

FIG. 12 is a top view of one side of the bracket of FIG. 1.

FIG. 13 is a bottom view of one side of the bracket of FIG. 1.

FIG. 14 is an outer side view of the bracket of FIG. 1.

FIG. 15 is an inner side view of the bracket of FIG. 1.

FIG. 16 is a front view of the retention mechanism of FIG. 1.

FIG. 17 is a top view of the retention mechanism of FIG. 1.

FIG. 18 is an outer side view of the retention mechanism of FIG. 1.

FIG. 19 is an inner side view of the retention mechanism of FIG. 1.

FIG. 20 is a front sectional view of the assembly of FIG. 1 at an initial stage of insertion into the retention mechanism.

BEST MODE FOR CARRYING OUT THE INVENTION

Figure 1:
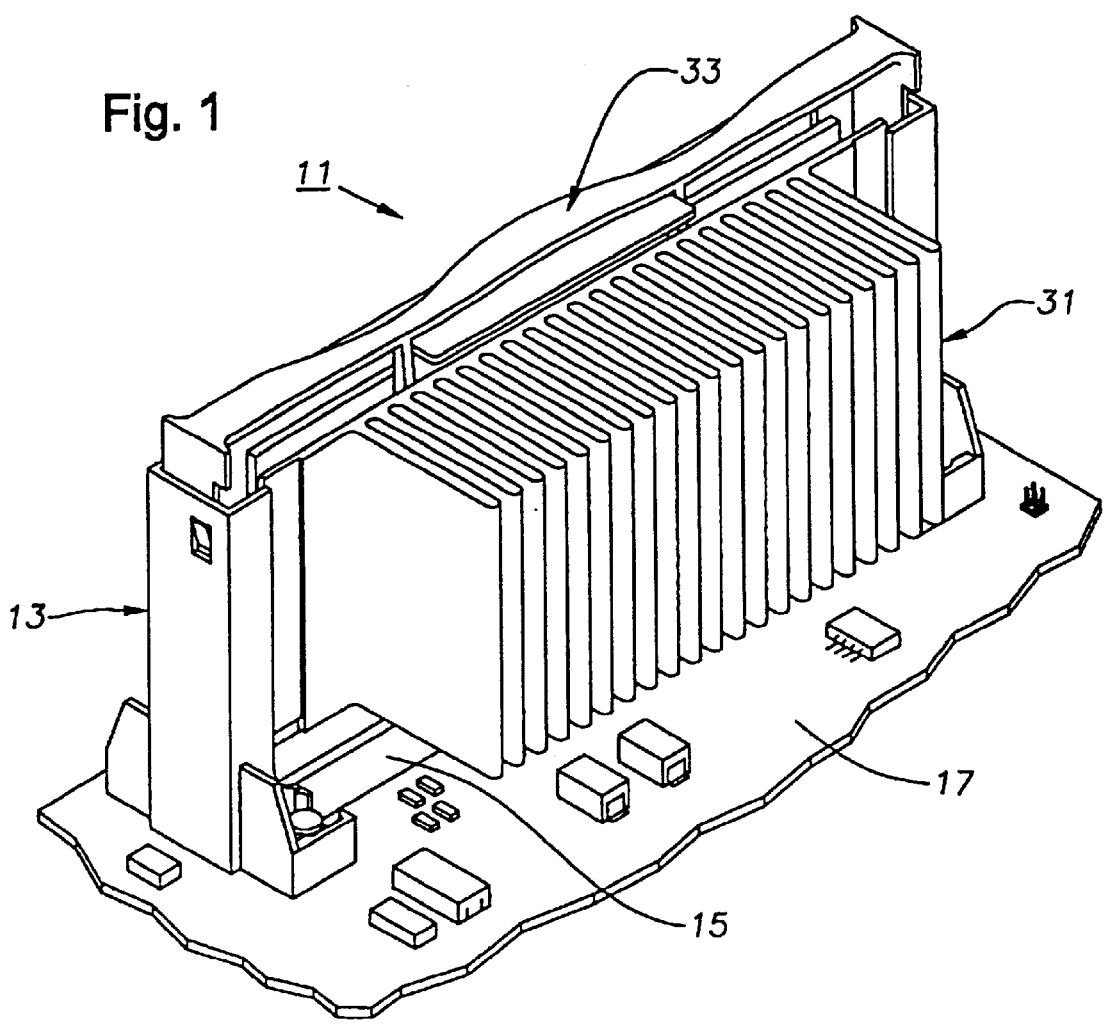
FIG. 1 is a front isometric view of a cartridge/bracket assembly installed in a retention mechanism and is constructed in accordance with the invention.

Referring to FIG. 1, a cartridge/bracket assembly 11 is shown installed in a retention mechanism 13. Retention mechanism 13 is mounted adjacent to an elongated socket 15 (FIGS. 16–19) on a printed circuit board 17. Socket 15 is provided for receiving the connector edge 19 (FIG. 2) of assembly 11 and is electrically interconnected to board 17. Board 17 is a main system circuit board or motherboard for a computer (not shown) and has a large plurality of electrical components.

As shown in FIGS. 2–5, assembly 11 comprises a processor cartridge 31 and a generally U-shaped, flexible plastic bracket 33. Bracket 33 is detachably coupled to cartridge 31 as will be described below in further detail. Referring now to FIGS. 6–9, cartridge 31 comprises a small circuit board 35 with at least one microprocessor chip 37 (FIG. 9) and various other electrical components, a heatsink 39 mounted to chip 37, and a cover 41 mounted to board 35 opposite chip 37. The connector edge 19 forms the lower edge of board 35 which extends beneath chip 37. Heatsink 39 has a rectangular notch 43 in each of its lateral sides for engaging bracket 33 as will be described below. Cover 41 has a horizontally disposed tab 45 on the front side of its upper end.

FIGS. 10–15 illustrate the particular features of bracket 33. Bracket 33 includes a substantially horizontal handle 51 that is contoured as shown to achieve desired bending characteristics and for ergonomic considerations. Handle 51 has a pair of short vertical fingers 52 that are spaced apart about its midpoint. Fingers 52 are provided for releasably engaging tab 45 on cover 41. A downward depending, flat arm 53 is located on each end of handle 51. Note that arms 53 are substantially perpendicular to, but tapered inward slightly relative to handle 51. An outward protruding, triangular prism or tooth 55 is located near the upper end of each arm 53 on its outer surface. Each tooth 55 is saw-tooth in shape and has a flat upper surface 57 that is substantially perpendicular to arm 53, and a hypotenuse surface 59.

The lower end of each arm 53 terminates in a flat shoulder 61. Shoulders 61 also act as hinges between arms 53 and upward-turned extensions 63 on the inner sides of arms 53. There is a very small acute angle between each arm 53 and extension 63 combination, with the apex of the angles being defined at shoulders 61. Extensions 63 are about half as long as arms 53, and are generally L-shaped when viewed from above with a flat front surface 65 (FIG. 10). Each front surface 65 has a small rectangular tab or protrusion 67 that extends forward from its upper outer corner. Each extension 63 also has rear surface 69 (FIGS. 11 and 15) and a perpendicular inner surface 71. Each rear surface 69 has a shallow, inverted L-shaped lip 73 that extends rearward from its upper inner corner. Each inner surface 71 has three horizontal ribs 75 which are spaced apart from one another at its top, middle, and bottom. Ribs 75 extend inward a short distance from inner surface 71.

Referring now to FIGS. 16–19, retention mechanism 13 comprises an elongated, rectangular base 81 with a central hole 83 for accommodating socket 15. Base 81 is mounted to board 17 with a fastener 85 near each of its four corners. A pair of upright support posts 87 extend perpendicularly from the ends of base 81. Posts 87 are generally U-shaped channel members that are slightly longer than arms 53 of bracket 33. Each post 87 has a substantially rectangular hole 89 in its side near its upper, forward corner. Holes 89 are located directly across from one another and are provided for accommodating teeth 55 on bracket 33.

Figure 2:
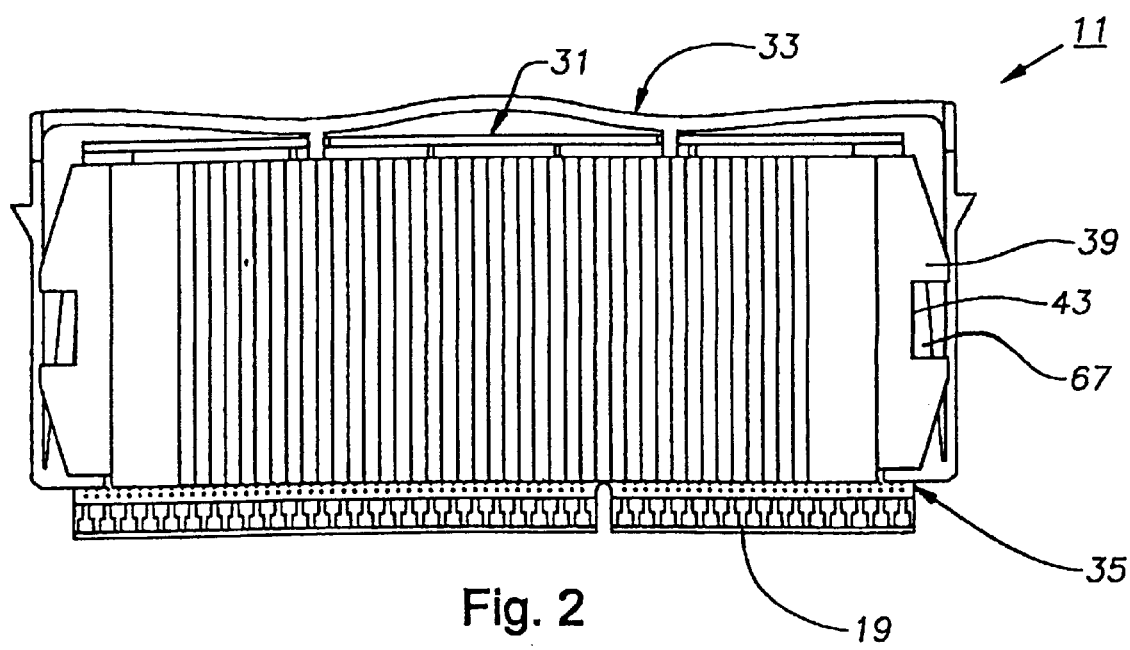
FIG. 2 is a front view of the cartridge/bracket assembly of FIG. 1.
Figure 3:
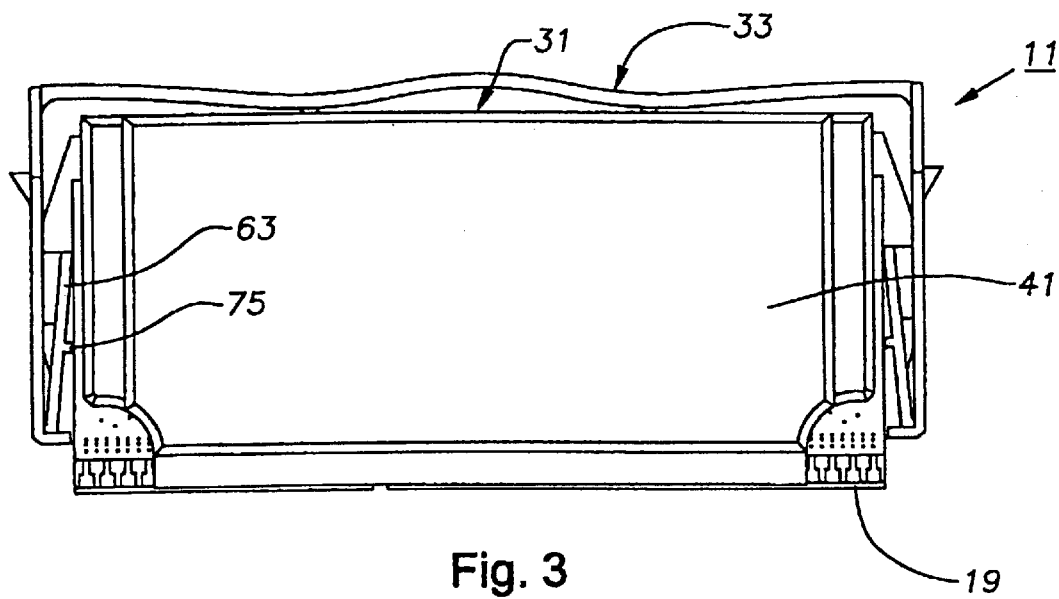
FIG. 3 is a rear view of the cartridge/bracket assembly of FIG. 1.
Figure 4:
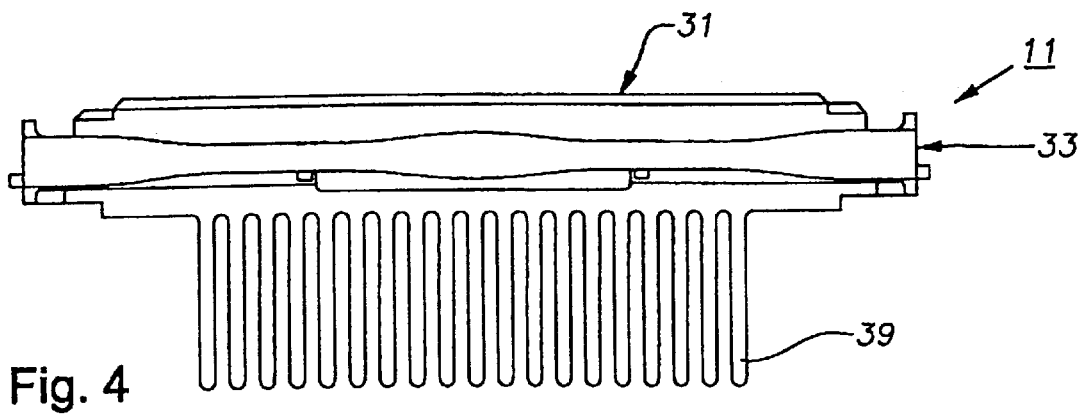
FIG. 4 is a top view of the cartridge/bracket assembly of FIG. 1.
Figure 5:
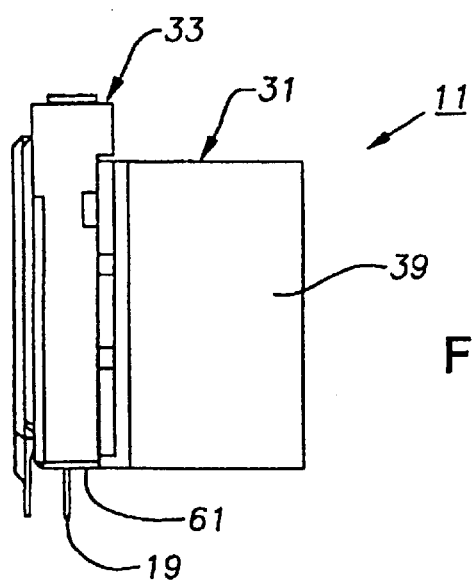
FIG. 5 is a side view of the cartridge/bracket assembly of FIG. 1.
Figure 6:
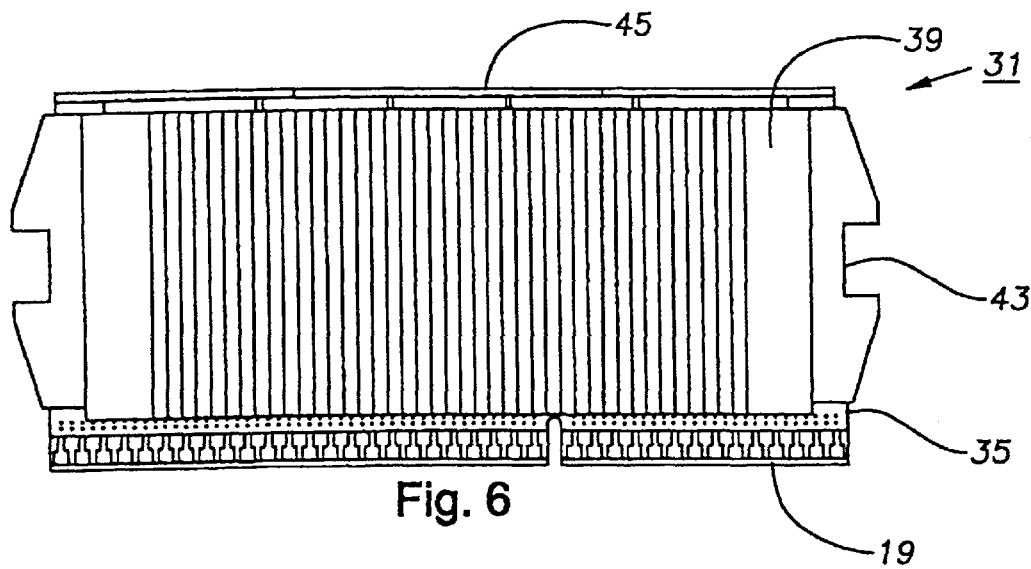
FIG. 6 is a front view of the cartridge of FIG. 1.
Figure 7:
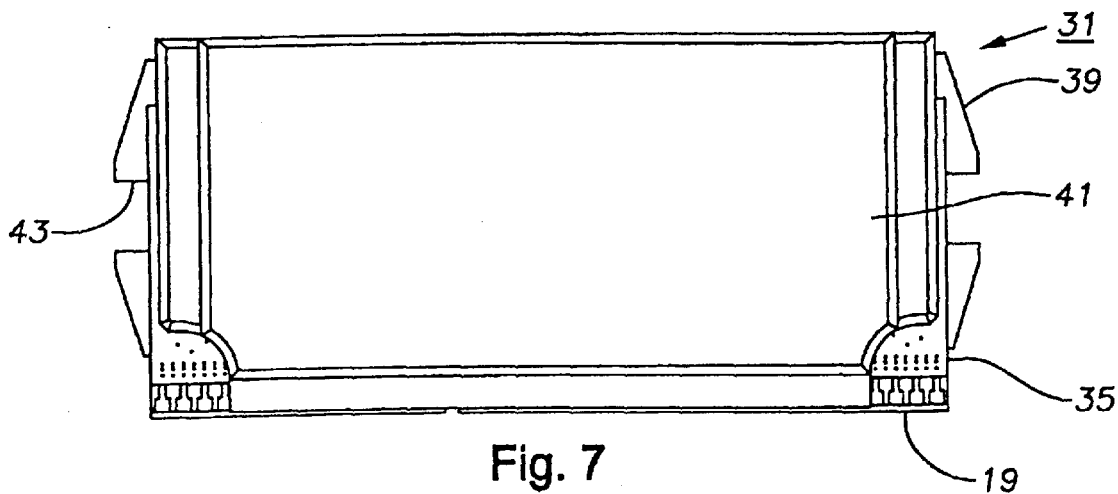
FIG. 7 is a rear view of the cartridge of FIG. 1.
Figure 8:
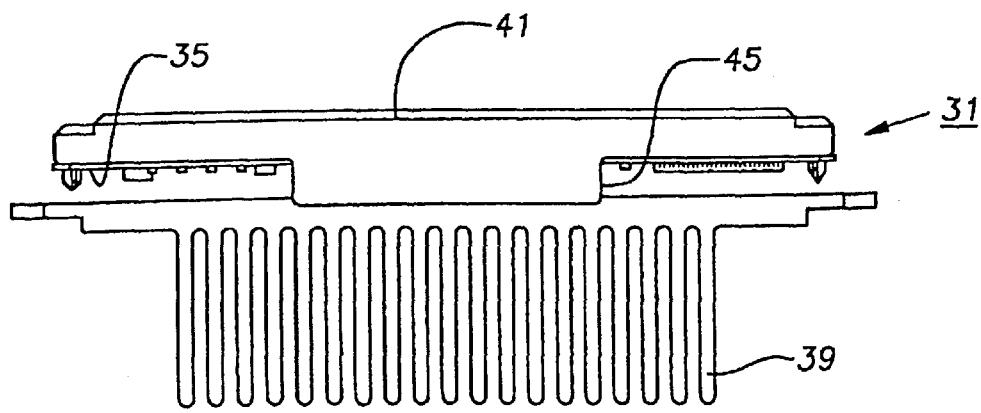
FIG. 8 is a top view of the cartridge of FIG. 1.

In operation, cartridge/bracket assembly 11 (FIG. 2) is formed by securing bracket 33 to cartridge 31. This is done by flexing arms 53 slightly outward and sliding extensions 63 into the slots or gaps between circuit board 35 and heatsink 39. When bracket 33 is properly installed on cartridge 31, front surfaces 65 abut heatsink 39 with protrusions 67 seated in notches 43, and rear surfaces 69 face board 35 with lips 73 in abutment thereof. In addition, the three ribs 75 on inner surface 71 of bracket 33 abut the vertical side edges of card 35 (FIG. 3) for a snug but flexible fit. Shoulders 61 are substantially flush with the bottom edge of heatsink 39 (FIG. 5), and fingers 52 on handle 51 are located immediately adjacent to each side edge of tab 45 on cover 41 (FIGS. 2 and 4).

In the next step (FIG. 20), cartridge/bracket assembly 11 is installed in retention mechanism 13 by centering the lower end of assembly 11 between the upper ends of posts 87 and pushing assembly 11 downward therebetween as indicated by the arrows. The channel-like posts 87 are just wide enough to accept the width of assembly 11 between the front side of heatsink 39 and the rear sides of arms 53. The downward force applied to bracket 33 is transmitted to cartridge 31 by contact between handle 51 and tab 45, and the contact between the lower ends of protrusions 67 and notches 43 in heatsink 39.

Figure 21:
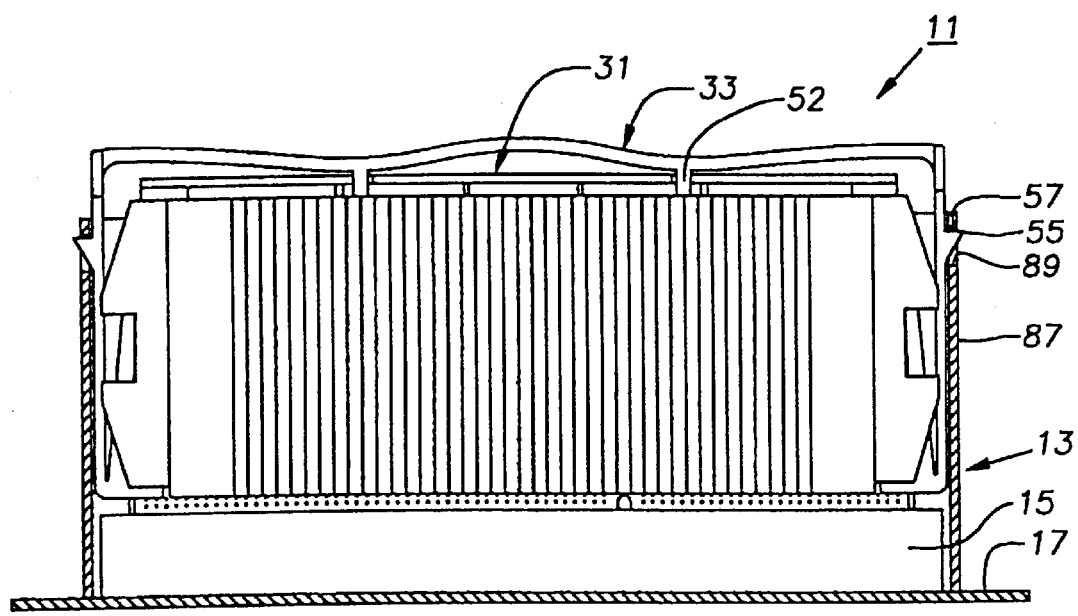
FIG. 21 is a front sectional view of the assembly of FIG. 1 fully seated in the retention mechanism.

As teeth 55 on the outer surfaces of bracket 33 engage the inner surfaces of posts 87, the hypotenuse surfaces 59 of teeth 55 force posts 87 to pivot outward slightly about their bases (FIG. 20). Retention mechanism 13 is formed from such materials and secured to board 17 in a such a manner that a limited amount of play or movement is permissible. Posts 87 are flexed outward as assembly 11 descends and teeth 55 slide along the inner surfaces of posts 87. When teeth 55 engage holes 89 in posts 87, posts 87 snap back to their upright positions (FIG. 21) against the outer surfaces of arms 53. At this stage card connector edge 19 is fully seated in socket 15 and assembly 11 is prevented from upward movement since the flat upper surfaces 57 of teeth 55 are locked in abutment with holes 89. Handle 51 is substantially parallel to circuit board 17 at this time.

Figure 22:
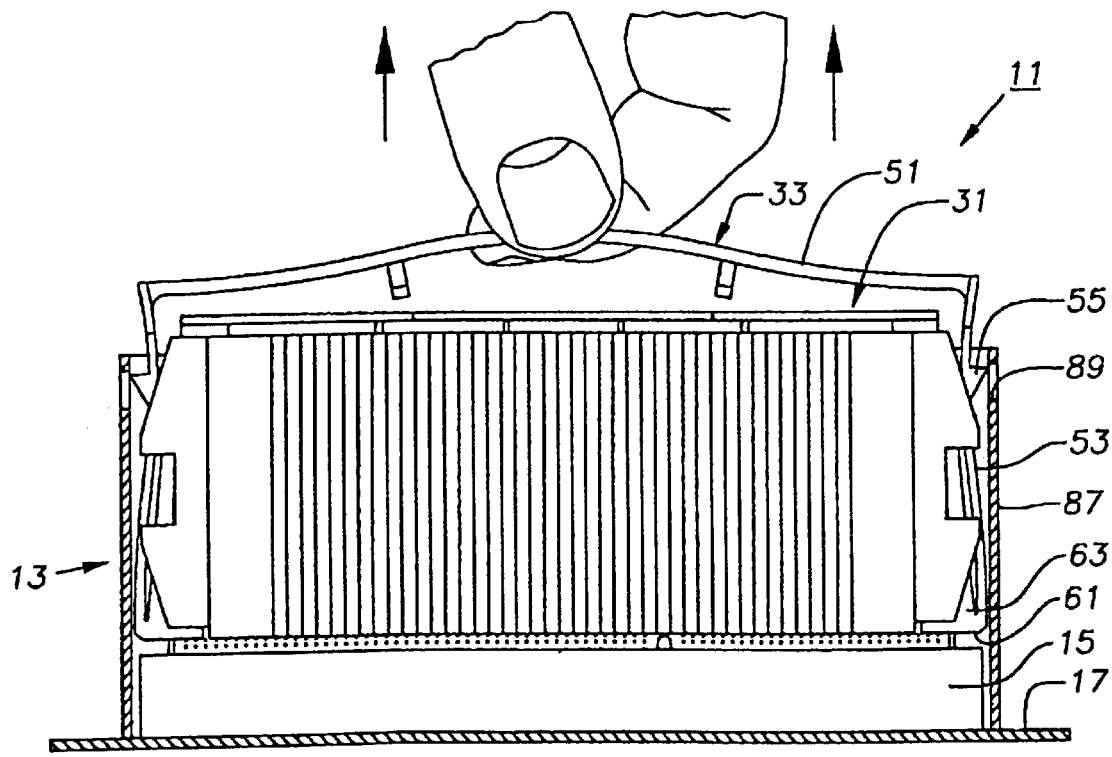
FIG. 22 is a front sectional view of the assembly of FIG. 1 at an initial stage of removal from the retention mechanism.
Figure 23:
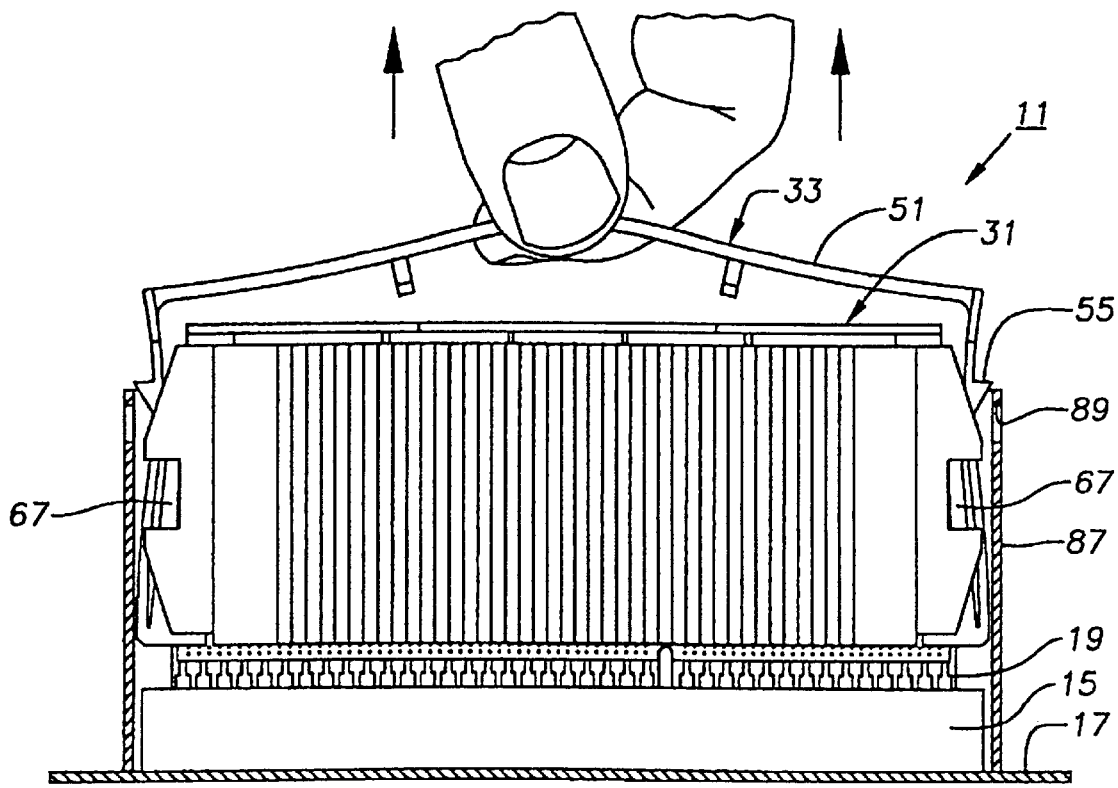
FIG. 23 is a front sectional view of the assembly of FIG. 1 at an intermediate stage of removal from the retention mechanism.

As shown in FIG. 22, connector edge 19 is disconnected from socket 15 and, thus, assembly 11 is removed from retention mechanism 13 by pulling upward on handle 51 as shown by the arrows. The flexible but resilient plastic of bracket 33 allows it to elastically flex in such as manner that arms 53 are flexed or pivoted inward relative to shoulders 61 while extensions 63 remain in contact with cartridge 31. This motion allows teeth 55 to retract away from and out of interference with holes 89. Note that the upward force required to cause the disengaging motion of bracket 33 is less than the frictional force holding connector edge 19 in socket 15. Thus, bracket 33 will always disengage retention mechanism 31 before edge 19 begins to slide out of socket 15. Additional upward force on handle 51 (FIG. 23) causes bracket 33 to further elastically deform and pulls edge 19 out of socket 15 so that assembly 11 is completely removed from retention mechanism 13.

The invention has several advantages. The simple, inexpensive bracket allows technicians to easily install, remove, replace, and/or upgrade electrical components with one hand. The bracket is compatible with both existing cartridges and retention mechanisms, as well as with newer designs. The efficient, reliable design requires no fasteners such as screws for mounting. The design is also adaptable to subject components of all sizes while retaining its single hand operability. The centrally located handle helps maintain symmetric insertion/extraction forces on the component so that it is not accidentally rocked into or out of place. This decreases the probability for damage to the connectors.

While the invention has been shown or described in only some of its forms, it should be apparent to those skilled in the art that it is not so limited, but is susceptible to various changes without departing from the scope of the invention.

We claim:

1. An apparatus, comprising in combination:
    a retention mechanism having a base and a pair of support posts extending from the base, wherein the base is adapted to be mounted to a circuit board having an electrical socket;
    a processor cartridge having lateral side edges, a processor board with a connector edge, a processor mounted to the processor board and electrically connected to the connector edge, and a heatsink mounted to the processor;
    a single flexible bracket releasably secured to the processor cartridge, the bracket having a handle and a pair of arms extending from the handle and attached to the side edges of the processor cartridge; and wherein
    the cartridge and the bracket form an assembly that selectively mounts to the retention mechanism by inserting the arms between the support posts such that the arms interconnect with the support posts to secure the assembly in the retention mechanism, and the connector edge electrically engages the socket on the circuit board; and wherein
    the assembly is removed from the retention mechanism by pulling on the handle to release the arms from the support posts and lifting the assembly out of the retention mechanism.

2. The apparatus of claim 1 wherein each of the support posts of the retention mechanism has a side wall with an aperture, and each of the arms of the bracket has a protrusion that engages one of the apertures when the assembly is mounted to the retention mechanism, and wherein the protrusions disengage the apertures when the assembly is removed from the retention mechanism.

3. The apparatus of claim 2 wherein the protrusions are saw-tooth in shape.

4. The apparatus of claim 2 wherein the protrusions are located on outer surfaces of the arms.

5. The apparatus of claim 1 wherein the arms have distal ends and extensions depending from the distal ends toward the handle.

6. The apparatus of claim 5 wherein the extensions are located adjacent to inner surfaces of the arms.

7. The apparatus of claim 5 wherein the extensions engage the side edges of the cartridge.

8. The apparatus of claim 5 wherein the extensions insert into slots between the processor board and the heatsink.

9. The apparatus of claim 5 wherein the heatsinks have notches and the extensions have tabs that seat in the notches.

10. The apparatus of claim 5 wherein when the handle is pulled, the arms flex inward relative to the distal ends such that the protrusions move inward out of engagement with the apertures in the support posts.

11. The apparatus of claim 1 wherein the force required to pull the handle to disengage the arms is less than the frictional force required to extract the connector edge of the processor board from the socket.

12. A bracket for releasably securing an electrical component to a retention mechanism, the component having lateral side edges and a connector edge, and the retention mechanism having a base and a pair of support posts with apertures extending from the base, wherein the base mounts to an electronic system having an electrical socket, the bracket comprising:
    a single flexible handle that is adapted to span between the lateral side edges of the component;
    an arm on each end of and extending from the handle, each of the arms having a protrusion extending therefrom, a distal end, an extension joined to each distal end and extending substantially parallel to each of the arms toward the handle and adapted to be detachably mounted to the side edges of the electrical component; and wherein
    the bracket is adapted to form an assembly with the component that selectively mounts to the retention mechanism by inserting the arms between the support posts such that the protrusions on the arms interconnect with the apertures in the support posts to secure the assembly in the retention mechanism and electrically engage the connector edge to the socket on the electronic system.

13. The bracket of claim 12 wherein the protrusions are saw-tooth in shape and located on outer surfaces of the arms.

14. The bracket of claim 12 wherein the extensions of the arms are located adjacent to and substantially parallel with inner surfaces of the arms.

15. The bracket of claim 12 wherein the extensions of the arms are adapted to engage the side edges of the cartridge.

16. The bracket of claim 12 wherein the extensions of the arms are adapted to insert into slots in the lateral side edges of the electrical component.

17. The bracket of claim 12 wherein the extensions have tabs that are adapted to seat in the lateral side edges of the electrical component.

18. The bracket of claim 12 wherein when the handle is pulled, the arms flex inward relative to the distal ends such that the protrusions move inward out of engagement with the support posts.

19. The bracket of claim 12 wherein the force required to pull the handle to disengage the protrusions from the support posts is adapted to be less than the frictional force required to extract the connector edge from the socket.

20. The bracket of claim 12 wherein the bracket is formed from elastic, resilient plastic.

21. The bracket of claim 12 wherein the arms are substantially perpendicular to the handle.

22. The bracket of claim 12 wherein the assembly is adapted to be removed from the retention mechanism by pulling on the handle to release the protrusions on the arms from the support posts and lifting the assembly out of the retention mechanism.

23. A method for installing and removing an electrical component in a retention mechanism having support posts on an electronic system with an electrical socket, the method comprising:
    (a) providing a flexible bracket having a single handle and a pair of arms extending from the handle, each of the arms having a protrusion;
    (b) detachably mounting the bracket to the component to form an assembly;

(c) inserting the assembly into the retention mechanism such that the protrusions on the arms of the bracket interconnect with the support posts to secure the assembly in the retention mechanism, and the component electrically engages the socket on the electronic system; and wherein the assembly is removed from the retention mechanism by:

(d) pulling on the handle to release the protrusions of the arms from the support posts and lifting the assembly out of the retention mechanism such that the component disengages the socket.

24. The method of claim 23 wherein step (b) comprises placing the arms of the bracket around side edges of the component.

25. The method of claim 23 wherein step (d) comprises flexing the arms inward such that the protrusions move inward out of engagement with the support posts.

* * * * *